(12) United States Patent
Naya et al.

(10) Patent No.: US 6,497,996 B1
(45) Date of Patent: Dec. 24, 2002

(54) FINE PATTERN FORMING METHOD

(75) Inventors: Masayuki Naya, Kaisei-machi (JP); Shinji Sakaguchi, Yoshida-cho (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/562,076

(22) Filed: May 1, 2000

(30) Foreign Application Priority Data

Apr. 30, 1999 (JP) .......................................... 11-123389

(51) Int. Cl.⁷ .......................... G03F 7/36; H01L 21/027
(52) U.S. Cl. ....................... 430/323; 430/166; 430/326; 438/707; 438/746
(58) Field of Search ............................... 430/323, 166, 430/326; 438/707, 746

(56) References Cited

U.S. PATENT DOCUMENTS

| | | | |
|---|---|---|---|
| 4,737,425 A | * 4/1988 | Lin et al. ...................... | 430/11 |
| 4,782,008 A | * 11/1988 | Babich et al. ............... | 430/313 |
| 4,822,716 A | 4/1989 | Onishi et al. | |
| 4,931,351 A | * 6/1990 | McColgin et al. .......... | 430/323 |
| 5,234,793 A | * 8/1993 | Sebald et al. ............... | 430/323 |
| 5,512,334 A | 4/1996 | Leuschner et al. | |
| 5,532,105 A | 7/1996 | Yamadera et al. | |

FOREIGN PATENT DOCUMENTS

| | | | |
|---|---|---|---|
| CA | 1314652 | 3/1993 | |
| EP | 0 229 629 A | 7/1987 | |
| EP | 0 330 209 A | 8/1989 | |
| JP | 11-317345 | 11/1999 | ......... H01L/21/027 |

OTHER PUBLICATIONS

Patent Abstracts of Japan vol. 015, No. 071 (P–1168), Feb. 19, 1991 (Abstract of JP 02 293850, Dec. 5, 1990).

* cited by examiner

*Primary Examiner*—John S. Chu
(74) *Attorney, Agent, or Firm*—Sughrue Mion, PLLC

(57) ABSTRACT

As shown in FIG. 1A, a first resist film 2 comprising organic high molecules and a second resist film 3 comprising a photosensitive material are sequentially applied to a substrate 1 by the spin coat method or the spray method for forming a two-layer resist. Then, a mask 4 with which a metallic fine opening pattern 6 is formed on a mask substrate 5 comprising a dielectric, such as glass, is tightly contacted with the two-layer resist. Then, light is projected onto the back of the mask substrate to carry out exposure with near field light 7 which is effused from the opening portions of the mask 4 where no metal is formed. Then, a pattern is formed by processing the second resist layer 3 for development with a developing solution. Thereafter, with the pattern in the second resist layer 3 being used as a mask, the first resist layer 2 is dry-etched with $O_2$ plasma to form a fine pattern having a high aspect ratio, and with the pattern in the two-layer resist, the substrate is worked by etching, vapor deposition, or the like, before the two-layer resist is peeled off.

18 Claims, 5 Drawing Sheets

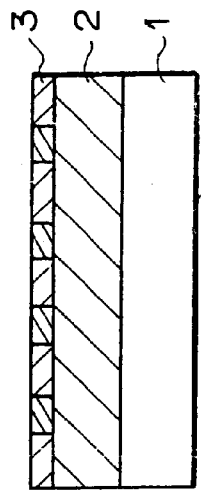
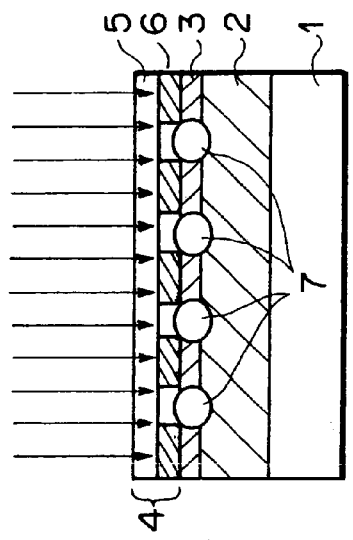
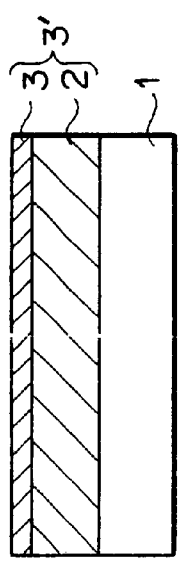
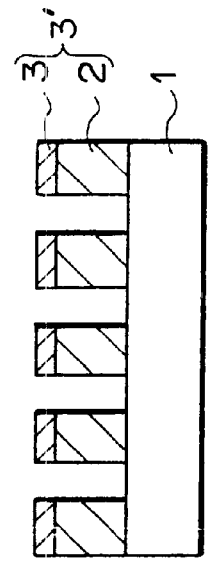
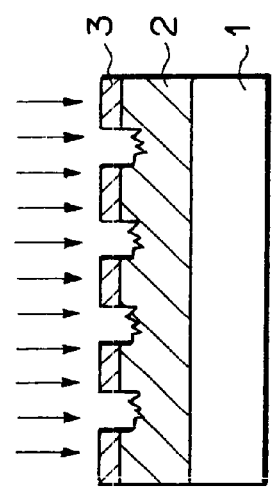
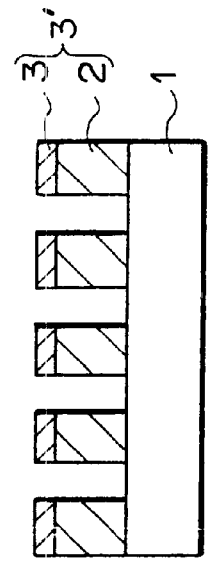

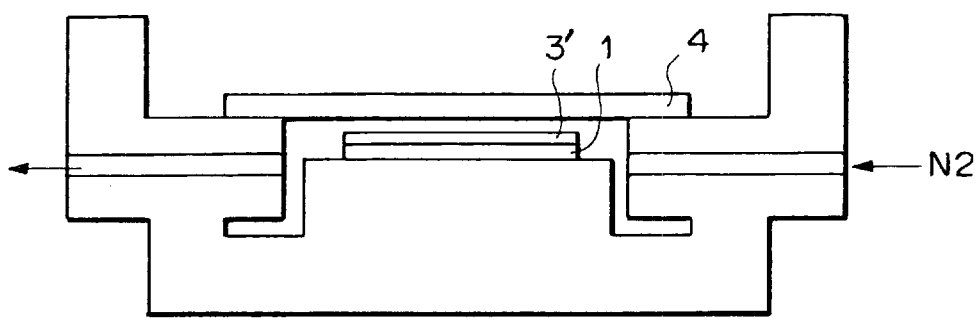
F I G. 2A
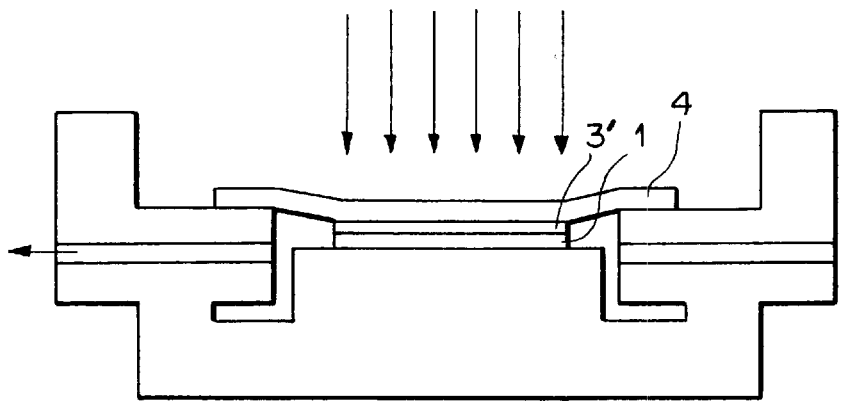
F I G. 2B
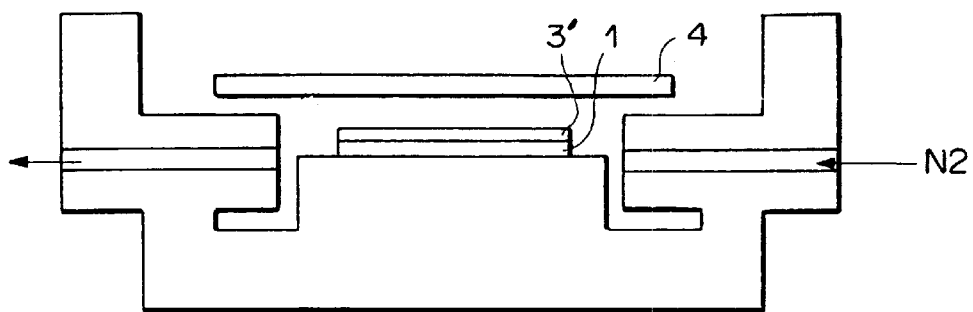
F I G. 2C

FINE PATTERN FORMING METHOD

BACKGROUND OF THE INVENTION

1. Field of the Invention

The present invention relates to a fine pattern forming method, and particularly to a method which forms a fine pattern on a substrate by photolithography using near field light.

2. Description of the Prior Art

The evolution of photolithography technology has been supported particularly by the advance of reduced projection exposure technology and resist technology. The performance of reduced projection exposure technology mainly depends upon two basic parameters, i.e., the resolution, RP, and the depth of focus, DOP. If the exposure wavelength for the projection optical system is $\lambda$, and the numerical aperture of the projection lens is NA, the above-mentioned two basic parameters are expressed by $RP=k_1\lambda/NA$, and $DOP=k_2\lambda/NA^2$. In order to improve the resolution for lithography, it is essential to reduce the wavelength $\lambda$, and increase the numerical aperture of the projection lens, NA. However, if NA is increased, the resolution is improved, but the depth of focus is reduced in inverse proportion to the square of NA. Therefore, reduction in wavelength $\lambda$ has been demanded in the trend toward finer pattern formation. The exposure wavelength $\lambda$ has been shortened from that for the g-line (436 nm) to that for the i-line (365 nm), and at present, the excimer laser (248 nm, 193 nm) has become the most popular.

However, with lithography using light, the diffraction limit for light provides the limit of resolution, and it is generally accepted that, if an F2 excimer laser with a wavelength of 248 nm is used, a fine pattern of 100 nm in line width is the limit of lithography using a lens series optical system. If it is attempted to provide a resolution in the order of less than 100 nm, electron beam or X-ray (particularly SOR light, i.e., synchrotron orbital radiation) lithography technology must be used.

Electron beam lithography can control the formation of a pattern in the order of nanometers with high accuracy, providing a significantly greater depth of focus than that for the optical system. In addition, it offers an advantage that it can directly draw a figure on the wafer without a mask, but because the throughput is low, and the cost is high, it has a drawback that it is far from suited to volume production.

X-ray lithography can provide an approx. one digit higher resolution and accuracy than those for the excimer laser lithography either when full-scale exposure is carried out with a 1-to-1 mask or when a reflection type image formation optical system is used for exposure. However, X-ray lithography presents problems that the mask is difficult to prepare, the feasibility is low, and the cost is high due to the device.

With lithography using an electron beam or X-ray, a resist must be developed in accordance with the exposure method, and problems still exist with respect to sensitivity, resolution, resistance to etching, etc.

As a method for solving the problems described above, a method has been proposed with which near field light effused from openings having a diameter sufficiently smaller than the wavelength of the projected light is used as a light source, and a fine pattern is formed by exposing the resist to the near field light and processing the resist for development. This method allows a spatial resolution in the order of nanometers to be obtained regardless of the wavelength for the light source.

However, unlike the conventional propagated light, the near field light has a propagation depth of as small as several tens of nm (therefore, the word "effused" is used in place of "propagated", and in the drawings, the near field light is depicted as if it were a drop of water hanging from a faucet). It is impossible to expose a thick-film resist having a thickness as large as 1000 nm, and a problem where it is difficult to form a resist pattern with a high aspect ratio is presented. Here, if the line width and the line height for the resist are "a" and "b", respectively, the aspect ratio is expressed as b/a, and it can be said that, for a given resist thickness, the higher the aspect ratio, the finer the pattern will be.

In addition, there is a problem that, when the substrate has a difference in level, it is difficult to apply the resist to a uniform thickness over the entire surface, even if the thickness of the resist is so small that the near field light can reach the bottom, which means that an area where the light cannot reach the bottom occurs in the resist, and it is extremely difficult to carry out high-precision lithography.

The fine pattern forming method according to the present invention is a fine pattern forming method in which a first resist layer capable of being removed by dry etching, and a photosensitive second resist layer having a resistance to dry etching with which only the irradiated portion or only the non-irradiated portion is made soluble in a developing solvent are stacked together in this order for creating a recording material, and by means for generating near field light on the projected light, the near field light is projected onto the second resist layer of the recording material in the form of a desired pattern. Thereafter, by processing the second resist layer for development, a pattern is formed in the second resist layer, and by using the pattern as a mask, the first resist layer is dry-etched to form a pattern on the substrate of the recording material.

The above-mentioned second resist layer preferably has a film thickness of 100 nm or less.

The fine pattern forming method according to the present invention preferably uses a recording material which provides antireflection means against the projected light on the substrate. In this case, the antireflection means is preferably an antireflection film formed between the substrate and the first resist layer, or an antireflection film formed between the first resist layer and the second resist layer.

The means for generating near field light may be a mask with which the near field light is generated from a metallic pattern formed on a material having a permeability to the projected light, and the metallic pattern is tightly contacted with the second resist layer or brought close thereto within the reach of the near field light for carrying out exposure.

The means for generating near field light may also be an optical stamp with which a convexity and concavity pattern is formed on the surface of a material having a permeability to the projected light, and near field light is generated from the convexity and concavity pattern by total reflection, and the convexity and concavity pattern is tightly contacted with the second resist layer or brought close thereto within the reach of the near field light for carrying out exposure.

The means for generating near field light may also be a probe having an opening with a diameter smaller than the wavelength of the projected light, and the probe is moved on the second resist to carry out exposure.

The second resist layer and the means for generating near field light are preferably tightly contacted with each other by carrying out evacuation in the exposure device for projecting the near field light.

The second resist layer and the means for generating near field light may be tightly contacted with each other by carrying out evacuation in the exposure device and blowing air from the back of the substrate for projecting the near field light.

The first resist layer is preferably etched by oxygen plasma.

The second resist layer preferably comprises a pattern forming material which contains a compound having silicon atoms. The content of the silicon atoms is preferably 1% to 50% of the solid content in the second resist layer.

The second resist layer may comprise a pattern forming material which contains at least one of a naphthoquinone diazide compound and a diazo ketone compound, and a water-insoluble and alkali-soluble silicone-containing polymer.

The second resist layer may comprise a pattern forming material which contains a water-insoluble and alkali-soluble silicone-containing polymer, a compound generating an acid when irradiated with active light beam or radiation, and a high molecular or low molecular compound which has a group capable of being decomposed by an acid, and the solubility of which in an aqueous alkali developing solution is increased under the action of the acid.

The second resist layer may comprise a pattern formation material which contains a water-insoluble silicone-containing polymer which has a group capable of being decomposed by an acid, the solubility of which in an aqueous alkali developing solution is increased under the action of the acid, and which has a functional group, a compound generating an acid when irradiated with active light beam or radiation, and a high molecular or low molecular compound which has a group capable of being crosslinked by the acid.

The second resist layer may comprise a pattern formation material which contains a water-insoluble silicone-containing polymer which has an olefin unsaturated group and the solubility of which in an aqueous alkali developing solution is decreased through the polymerization reaction, and a compound providing a polymerization reaction initiating capability when irradiated with active light beam or radiation.

The second resist layer may comprise a pattern formation material which contains a water-insoluble and alkali-soluble silicone-containing polymer, a compound providing a polymerization reaction initiating capability when irradiated with active light beam or radiation, and a high molecular or low molecular compound which has an olefin unsaturated group and the solubility of which in an aqueous alkali developing solution is decreased through the polymerization reaction.

With the fine pattern forming method of the present invention, a pattern having a line width of 100 nm or less, which is said to be the limit for the conventional photolithography, can be formed by exposing the resist to the near field light effused from the pattern having a line width sufficiently smaller than the wavelength of the projected light, and processing the resist for development.

Up to now, the resolution for lithography has mainly depended upon the wavelength for the light source, but the light source for generating the near field light may have any wavelength, which means there is no need to develop a new light source, which allows a substantial cost reduction.

As the resist, a two-layer resist having a photosensitive resist and a resist of the lower layer comprising organic high molecules is used, which allows the surface to be flattened with the resist of the organic high molecules, and therefore the film thickness of the photosensitive resist of the upper layer to be made uniform, even when the substrate has a difference in level, resulting in an area where the near field light cannot reach the bottom being produced in the first layer. Consequently, the near field light can be uniformly projected even for a pattern having a large area, and a precision pattern of the photosensitive resist can be formed. By using the pattern of the photosensitive resist as a mask for patterning the resist layer of the organic high molecules, which is the lower layer, by the conventional dry-etching method, a fine pattern having a high aspect ratio can be easily formed.

After working the substrate, the two-layer resist can be easily peeled off with a well-known organic solvent which is used as the solvent for the resist, because the organic high molecule resist layer has not been changed by the exposure, which offers an advantage of a good productivity.

Thus, with the fine pattern forming method of the present invention which uses near field light and a two-layer resist, a fine pattern of 100 nm or less can be formed with a high aspect ratio and at a low cost.

SUMMARY OF THE INVENTION

The present invention provides a fine pattern forming method which assures a high aspect ratio in lithography using near field light.

BRIEF DESCRIPTION OF THE DRAWINGS

FIG. 1A to FIG. 1F are drawings illustrating a fine pattern forming method according to a first embodiment of the present invention, FIG. 2A to FIG. 2C are drawings illustrating a contact exposure device during evacuation, FIG. 3A

DESCRIPTION OF THE PREFERRED EMBODIMENTS

Figure 3A:
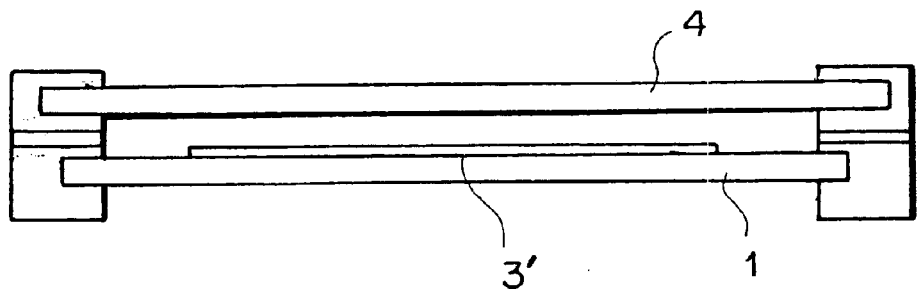
FIG. 3B is a drawing illustrating a contact exposure device during air blow and evacuation.

Hereinbelow, embodiments of the present invention will be specifically described with reference to the drawings.

FIG. 1A to FIG. 1F are drawings illustrating a fine pattern forming method according to a first embodiment of the present invention.

As shown in FIG. 1A, a first resist film 2 comprising organic high molecules and a second resist film 3 comprising a photosensitive material are sequentially applied to a substrate 1 by the spin coat method or the spray method to form a two-layer resist 3'. Then, as shown in FIG. 1B, a mask 4 with which a metallic fine opening pattern 6 is formed on a mask substrate 5 comprising a dielectric, such as glass, is tightly contacted with the two-layer resist. Then, when light, such as i-line (365 nm), is projected onto the back of the mask substrate 5 for carrying out exposure with near field light 7 which is effused from the opening portions of the mask 4 where no metal is formed, the resist under the opening portions is exposed as shown in FIG. 1C.

Here, the contact exposure technique will be described with reference to the sectional drawings for the contact exposure device on evacuation as shown in FIG. 2A and FIG. 2B. First, a wafer having the two-layer resist 3' applied onto the substrate 1 is loaded on the mount of the exposure device, and the mask 4 is loaded over it in the vicinity thereof. Before exposure, inert gas, such as $N_2$, is always streamed between the mask and the resist in the device as shown in FIG. 2A. In exposure, the space between the mask and the resist is evacuated to contact the mask with the resist as shown in FIG. 2B. Thereafter, the purge $N_2$ gas is again injected to separate the mask from the resist as shown in FIG. 2C.

Then, by processing the second resist layer 3 for development with a developing solution as shown in FIG. 1D, the exposed portions are made soluble in the developing solvent, resulting in a positive type pattern being formed. Thereafter, with the pattern in the second resist layer 3 being used as a mask, the first resist layer 2 is dry-etched with $O_2$ plasma, as shown in FIG. 1E, to form a fine pattern having a high aspect ratio as shown in FIG. 1F. Ion dry etching or gas etching may be performed instead of the dry etching. Thereafter, with the pattern in the two-layer resist 3', the substrate is worked by etching, vapor deposition, or the like, before the two-layer resist is peeled off.

This peeling can be simply practiced by dissolving the first resist because the exposure, etc. have not changed the first resist in any way. In addition, the peeling can also be performed by plasma ashing.

The photosensitive resist of the second resist layer 3 may be a negative type resist, with which only the portions exposed to the projected light use insoluble in the developing solvent, and it is preferable that the thickness of the second resist layer be equal to or less than the depth to which the near field light is effused.

The organic polymeric material for the first resist layer 2 may be any material, provided that it can be etched by oxygen plasma, and a well-known photoresist may be used. However, from the viewpoint of the resistance to plasma in dry etching the substrate, it is preferable to use an aromatic-containing polymer.

Figure 3B:
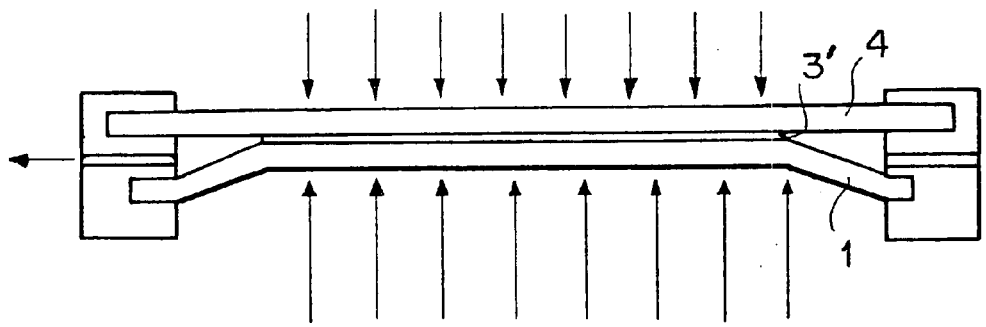

With the present embodiment, a contact exposure device on evacuation is used. However, as shown in FIG. 3A and FIG. 3B, the air blow technique with which air blow from the back of the substrate 1 on which the two-layer resist 3' is formed, and the above-mentioned evacuation are used to contact the resist with the mask as shown in FIG. 3A and FIG. 3B, and the light is projected from the back of the mask for carrying out the exposure may be employed. FIG. 3A and FIG. 3B are sectional drawings for that exposure device.

Figure 4:
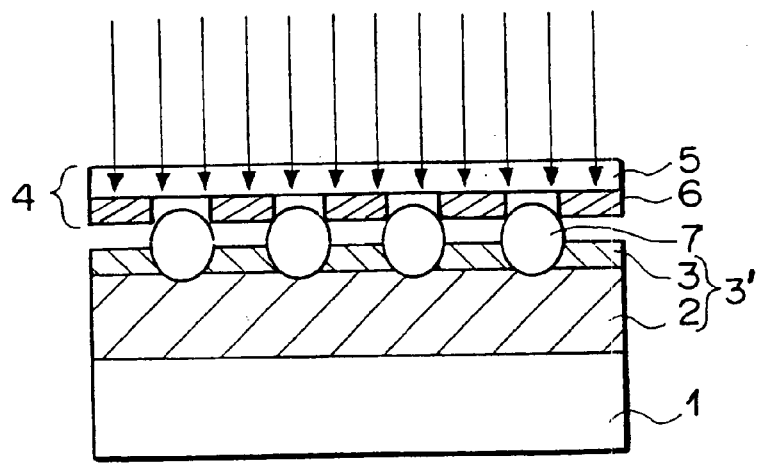
FIG. 4 is a drawing illustrating a fine pattern formation method using the proximity exposure technique according to the first embodiment of the present invention.

Further, as shown in FIG. 4, the proximity exposure technique with which the mask is brought close to the two-layer resist 3' within the reach of the near field light for exposure may be used. By carrying out the proximity exposure, such problems as possible damage to the mask and/or wafer, and the possibility of dirt being deposited on the wafer can be eliminated, resulting in the output being improved, which allows volume production.

Next, a second embodiment of the present invention will be described.

Figure 5:
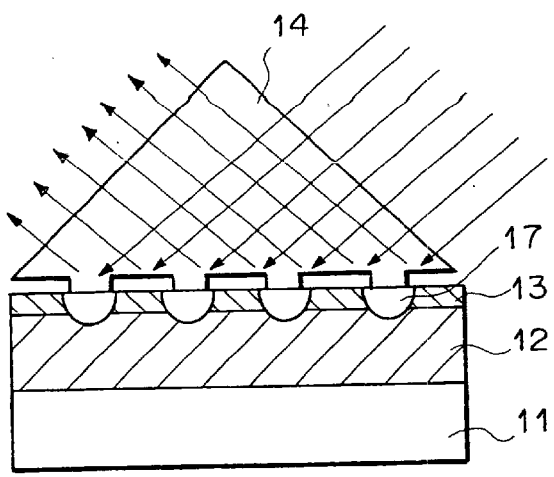
FIG. 5 is a drawing illustrating a fine pattern forming method using an optical stamp according to a second embodiment of the present invention.

FIG. 5 illustrates a method for fine pattern formation using an optical stamp according to the second embodiment of the present invention.

As shown in FIG. 5, a first resist layer 12 comprising organic high molecules and a second resist layer 13 comprising a photosensitive material are applied onto a substrate 11 in sequence. An optical stamp 14 which generates near field light from the convexity and concavity pattern by total reflection is projected onto the second resist layer 13, which is then processed for development to form a pattern. Thereafter, as with the first embodiment, the first resist layer 12 is etched with the pattern in the second resist layer 13 being used as a mask to form a pattern having a high aspect ratio.

The optical stamp is not made of a metal as with a mask, offering an advantage that it can be prepared at low cost.

Figure 6:
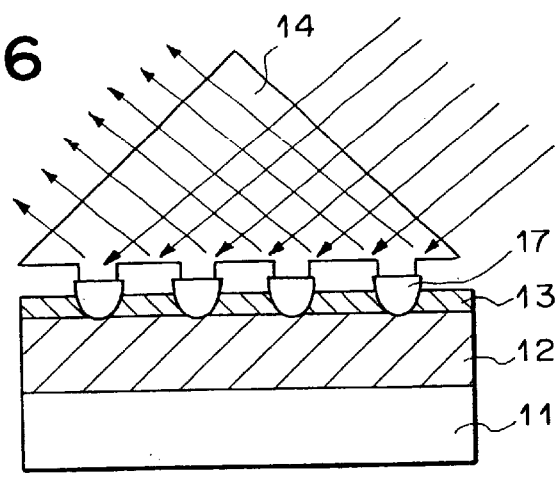
FIG. 6 is a drawing illustrating a fine pattern forming method using the optical stamp according to the second embodiment of the present invention and the proximity exposure technique.

Further, as shown in FIG. 6, the optical stamp may be used for pattern formation by proximity exposure as stated above.

Next, a third embodiment of the present invention will be described.

Figure 7:
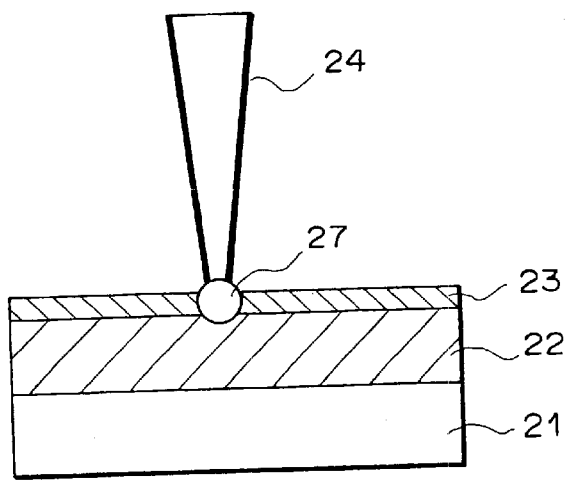
FIG. 7 is a drawing illustrating a fine pattern forming method using a probe according to a third embodiment of the present invention.

FIG. 7 is a drawing illustrating a method for fine pattern formation using a probe according to a third embodiment of the present invention.

As shown in FIG. 7, a first resist layer 22 comprising organic high molecules and a second resist layer 23 comprising a photosensitive material are applied onto a substrate 21 in sequence. Near field light 27 is generated from the tip of a probe 24 having an opening with a diameter smaller than the wavelength for the light source, and the probe 24 is moved in the form of a desired pattern on the second resist to carry out exposure. By processing the second resist layer 23 for development, a pattern is formed in the second resist layer 23. Thereafter, as with the first and second embodiments, the first resist layer 22 is etched with the pattern in the second resist layer 23 being used as a mask to form a pattern having a high aspect ratio.

Figure 8:
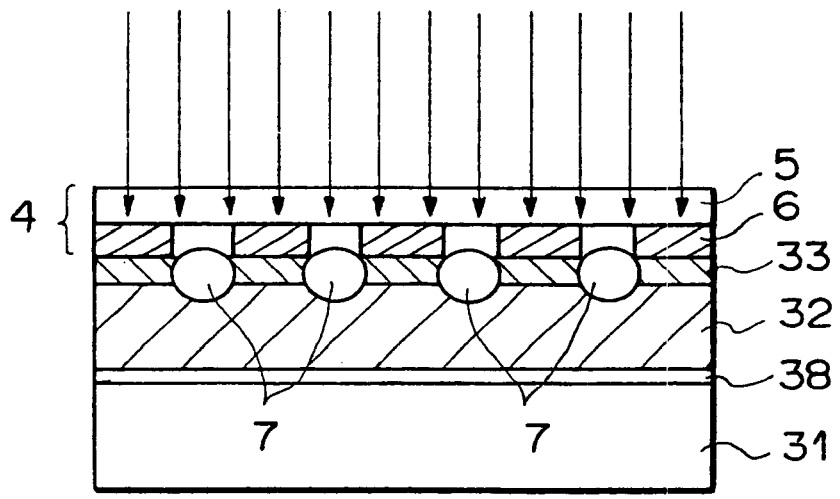
FIG. 8 is a drawing illustrating an antireflection layer being provided between the substrate and the first resist.
Figure 9:
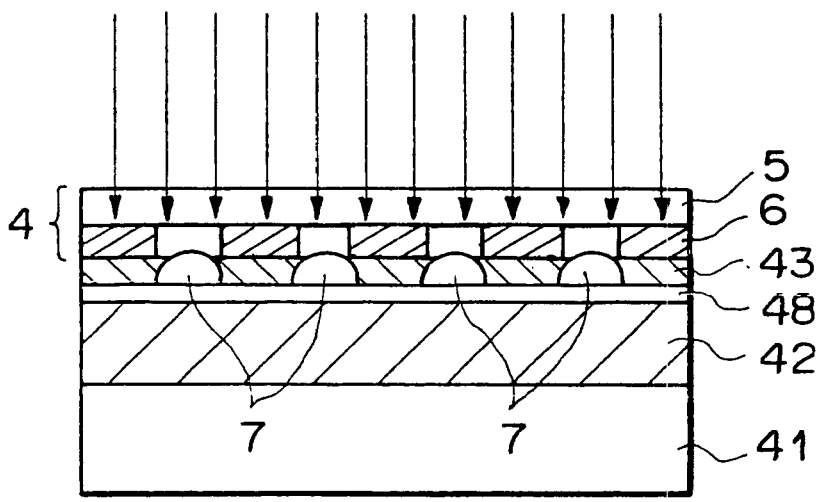
FIG. 9 is a drawing illustrating an antireflection layer being provided between the first resist and the second resist.

Because the near field light is effused to a depth as small as several tens of nm, there is practically no possibility of the light being reflected. However, to prevent the light from being scattered from the back, the resist layer configuration may comprise an antireflection layer 38 between a substrate 31 and a first resist layer 32 in the configuration in which the first resist layer 32 and a second resist layer 33 are formed on the substrate 31 in this order, as shown in FIG. 8, or comprise an antireflection layer 48 between a first resist layer 42 and a second resist layer 43 which are formed on a substrate 41, as shown in FIG. 9. The elements in FIG. 8 and FIG. 9 which are the same as those in the above-described embodiments are each provided with the same reference numeral, and detailed description will be omitted here.

In the above-described embodiments, the substrate may be a semiconductor substrate of Si, GaAs, or the like, or a substrate on the top layer of which an insulation film, such as an $SiO_2$ film, is formed.

Next, the first resist layer and the second resist layer of the present invention, which are the recording materials, will be specifically explained.

The first resist layer of the present invention is formed of a material which can be dry-etched, particularly, of an organic polymeric material. It is preferable that an intermediate mixed layer be not formed between the first resist layer and the second resist layer to be formed thereupon, and therefore, the organic polymeric material for the first resist layer is preferably a material that will not dissolve in the solvent for the second resist layer, or a material that will not dissolve at room temperature, but, through heating or other treatment, will be crosslinked in the form of a network, and thus will not practically form an intermediate mixed layer.

An example of the latter is a resist for i-line or that for g-line which contains novolak resin and a naphtoquinone diazide compound, being used for such an application as manufacturing a semiconductor device, and which is applied to the required film thickness, and thereafter heat-treated for curing. Another example is a negative type resist which contains an alkaline solution soluble resin, such as novolak resin and polyhydroxy styrene, and an acidic crosslinking agent and a light acid generator, and which, after the application, is exposed to light over the entire surface for curing. Another example is a negative type resist which contains an alkaline solution soluble resin, such as novolak resin and polyhydroxy styrene, and a multifunctional monomer, and a photopolymerization initiator or a thermal polymerization initiator, and which, after application, is exposed to light over the entire surface or heat-treated for curing.

As a material for the first resist layer which will not form an intermediate mixed layer with the second resist layer, a composition which contains a vinyl polymer having at least one of a naphthyl group and an anthryl group in the side chain, and a composition which contains a vinyl polymer having at least one of a naphthyl group and an anthryl group in the side chain, and having a group being capable of crosslinked, and a cross linking agent can be mentioned.

For various purposes, an additive (such as fulleren and its derivative) may be added to the first resist layer.

For the resist layer of the present invention, a photosensitive resist material with which the near field light is projected to make only the irradiated portion or the non-irradiated portion soluble in the developing solvent, the remaining portion having a resistance to dry etching is used. As this resist material, it is preferable to use a material which contains a compound having silicon atoms, and with which the content of silicon in the solid content exceeds a certain value. When dry etching is practiced with oxygen-containing plasma, the higher the content of silicon, the better, from the viewpoint of resistance to oxygen plasma. However, if the content of silicon is too high, the pattern formability, the residue, the pattern edge roughness, and the like are generally deteriorated, so the content of silicon is 1% or over, and preferably, it is 4% to 50%. Particularly, it is preferable that the content of silicon be 5% to 30%.

As the resist materials to be used for the second resist layer of the present invention, those as disclosed in Japanese Patent Nos. 2035509, 2094657, 2597163, 2606652, 2646241, 2646288, 2646289, Japanese Unexamined Patent Publication Nos. 60(1985)-191245, 62(1987)-247350, 62(1987)-36661, 62(1987)-36662, 62(1987)-38452, 62(1987)-96526, 62(1987)-136638, 62(1987)-153853, 62(1987)-159141, 62(1987)-220949, 62 (1987)-229136, 62(1987)-240954, 63(1988)-91654, 63(1988)-195649, 63(1988)-195650, 63(1988)-218948, 63(1988)-220241, 63 (1988)-220242, 63(1988)-241542, 63(1988)-239440, 63(1988)-313149, 1(1989)-44933, 1(1989)-46746, 1(1989)-46747, 1 (1989)-76046, 1(1989)-106042, 1(1989)-102550, 1(1989)-142720, 1(1989)-201653, 1(1989)-222254, 1(1989)-283555, 2(1990)-29652, 2(1990)-3054, 2(1990)-99954, 3(1991)-100553, 4(1992)-36754, 4 (1992)-36755, 4(1992)-104252, 4(1992)-106549, 4(1992)-107562, 4(1992)-130324, 4(1992)-245248, 6(1994)-27670, 6(1994)-118651, 6(1994)-184311, 6(1994)-27671, 6(1994)-35199, 6(1994)-43655, 6(1994)-95385, 6(1994)-202338, 6(1994)-342209, 7(1995)-114188, 8(1996)-29987, 8(1996)-160620, 8(1996)-160621, 8(1996)-160623, 8(1996)-193167, 10(1998)-319594, Japanese Patent Publication Nos. 6(1994)-7259, 6(1994)-42075, 6(1994)-56492, 6(1994)-79160, 6(1994)-84432, 7(1995)-27211, 7(1995)-60266, 7(1995)-69610, 7 (1995)-99435, 7(1995)-111582, 7(1995)-113772, U.S. Pat. Nos. 4,689,289, 4822716, EP No. 229629A1, Japanese Patent Application Nos. 10(1998)-354878, 11(1999)-31591, 11(1999)-20224, etc. can be mentioned.

Among these, materials which can be processed for development with an aqueous alkali developing solution are preferable because they produce no organic waste fluids, offer a low degree of swelling, and allow formation of a good pattern on the high developing power. More specifically, they are pattern formation materials which contain a water-insoluble and alkali-soluble silicone-containing polymer, and a photosensitive compound.

Even more specifically, a pattern formation material which contains a water-insoluble and alkali-soluble silicone-containing polymer, and a naphtoquinone diazide compound and/or a diazo ketone compound;

a positive type pattern formation material which contains a water-insoluble and alkali-soluble silicone-containing polymer, a compound generating an acid when irradiated with active light beam or radiation, and a high molecular or low molecular compound which has a group capable of being decomposed by an acid, and the solubility of which in an aqueous alkali developing solution is increased under the action of the acid;

a type pattern formation material containing a water-insoluble silicone-containing polymer which has a group capable of being decomposed by an acid, the solubility of which in an aqueous alkali developing solution is increased under the action of the acid, and which has a functional group, a compound generating an acid when irradiated with active light beam or radiation, and a high molecular or low molecular compound which has a group capable of being crosslinked by the acid and the solubility of which in an aqueous alkali developing solution is decreased under the action of the acid;

a negative type pattern formation material containing a water-insoluble silicone-containing polymer which has an olefin unsaturated group and the solubility of which in an aqueous alkali developing solution is decreased through the polymerization reaction, and a compound providing a polymerization reaction initiating capability when irradiated with active light beam or radiation; and a negative type pattern formation material containing a water-insoluble and alkali-soluble silicone-containing polymer, a compound providing a polymerization reaction initiating capability when irradiated with active light beam or radiation, and a high molecular or low molecular compound which has an olefin unsaturated group and the solubility of which in an aqueous alkali developing solution is decreased through the polymerization reaction; etc. can be mentioned.

As the above-mentioned water-insoluble and alkali-soluble silicone-containing polymer, water-insoluble and alkali-soluble polysiloxane or polysilsesquioxane is more preferable.

As the above-mentioned water-insoluble silicone-containing polymer which has a group capable of being decomposed by an acid, the solubility of which in an aqueous alkali developing solution is increased under the action of the acid, and which has a functional group, polysiloxane, polysilsesquioxane, or the like having an acid-decomposable group in the side chain, as disclosed in Japanese Patent Application No. 11(1999)-24236 and Japanese Patent Application No. 11(1999)-277016, or a silicone-containing vinyl polymer having an acid-decomposable group in the side chain, as disclosed in Japanese Patent Application No. 11(1999)-298606 and Japanese Patent Application No. 11(1999)-293882, can be used.

Among the above-mentioned materials, the positive type pattern formation material which contains a water-insoluble and alkali-soluble silicone-containing polymer, a compound generating an acid when irradiated with active light beam or radiation, and a high molecular or low molecular compound which has a group capable of being decomposed by an acid, and the solubility of which in an aqueous alkali developing solution is increased under the action of the acid, is particularly preferable.

Next, the water-insoluble and alkali-soluble silicone-containing polymer will be described with the general chemical formulae being given below. As the water-insoluble and alkali-soluble silicone-containing polymer, those having a repetitive unit(s) expressed by the following general formula(e) [I] and/or [II] as disclosed in Japanese Patent Application No. 10(1998)-354878 and Japanese Patent Application No. 11(1999)-143614, can be mentioned.

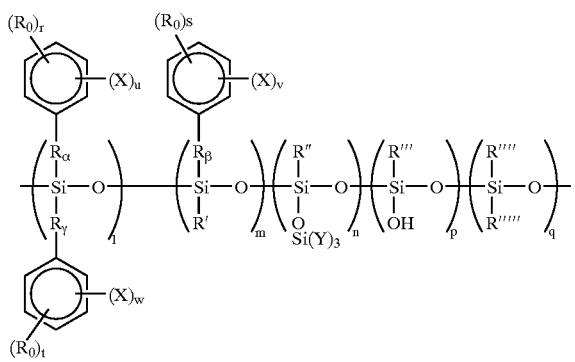

[I]

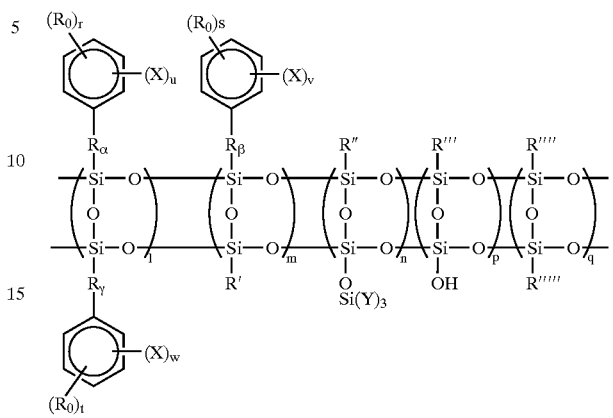

[II]

Where, in the general formulae [I] and [II], X is a group selected from the group consisting of the —C(=O)—R group, —CH(OH)—R group, —OH group, and carboxyl group, and the plurality of Xs in a particular formula may or may not be the same as one another. Here, R denotes a hydrocarbon group which may have a hydrogen atom or a substituent.

R' to R'''' may or may not be the same as one another, and are each a group selected from the group of chemical groups comprising the alkyl group, cycloalkyl group, alkoxy group, alkenyl group, aralkyl group, and phenyl group which may have a hydroxyl group or a substituent.

Y is an alkyl group, alkoxy group, or siloxyl group.

$R_0$ is a group selected from the group of chemical groups comprising the aliphatic hydrocarbon group and aromatic hydrocarbon group which may have a hydrogen atom, halogen atom, or a substituent.

r, s, and t are each an integer of 1 to 3, and u, v, and w are each an integer of 1 or 2.

l, m, n, and q are each 0 or a positive integer, and p is a positive integer.

$R\alpha$, $R\beta$, and $R\lambda$ each denote a single bond or —$(CH_2)_k$—$(Z\alpha)_j$—$R\delta$—.

$Z\alpha$ denotes —OCO—, —O—, —N(R$\epsilon$)CO—, —COO—, or —CON(R$\epsilon$)—.

$R\delta$ denotes a single bond, alkylene having 1 to 12 carbon atoms, a substituted alkylene, cycloalkylene, arylene, or aralkylene.

$R\epsilon$ denotes a hydrogen atom, or an alkyl group having 1 to 10 carbon atoms which may have been substituted.

k is 0 or a positive integer, and j is 0 or 1.

Further, as the water-insoluble and alkali-soluble silicone-containing polymer, those having a repetitive unit(s) expressed by the following general formula(e) [III] and/or [IV], as disclosed in Japanese Patent Application No. 11(1999)-20224 and Japanese Patent Application No. 11(1999)-31591, can also be mentioned.

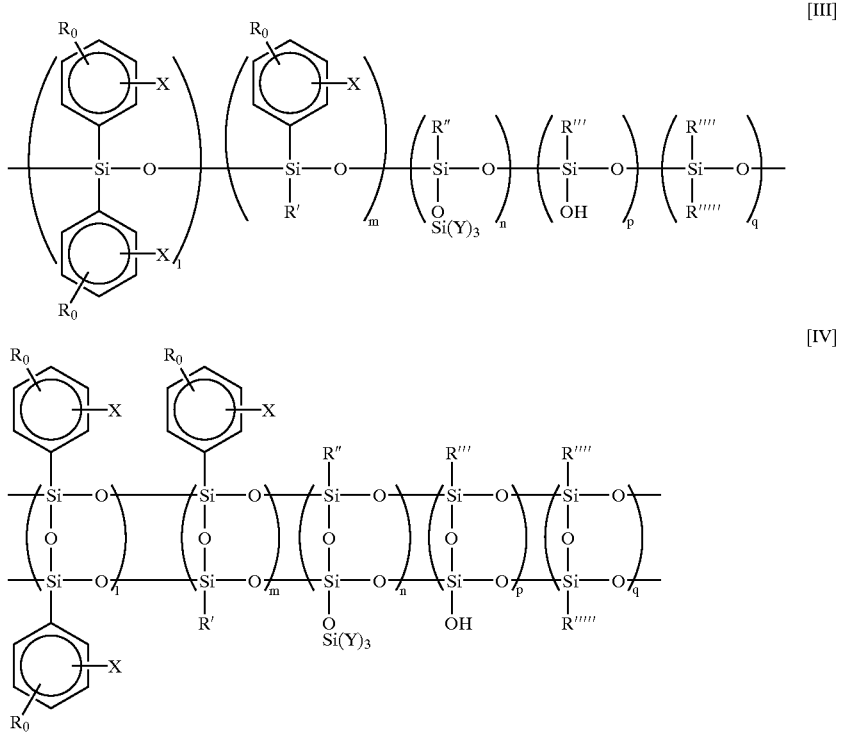

[III]

[IV]

Where, in the general formulae [III] and [IV], X is a group selected from the group consisting of the —C(=O)—R group, —CH(OH)—R group, and carboxyl group, and the plurality of Xs in a particular formula may or may not be the same as one another. Here, R denotes a hydrocarbon group which may have a hydrogen atom or a substituent.

R' to R'''' may or may not be the same as one another, and are each a group selected from the group of chemical groups comprising the alkyl group, cycloalkyl group, alkoxy group, alkenyl group, aralkyl group, and phenyl group which may have a hydroxyl group or a substituent.

Y is an alkyl group, alkoxy group, or siloxyl group.

$R_0$ is a group selected from the group of chemical groups comprising the aliphatic hydrocarbon group and aromatic hydrocarbon group which may have a hydrogen atom, halogen atom, or a substituent.

l, m, n, and q are each 0 or a positive integer, and p is a positive integer.

Next, the above-mentioned compound generating an acid when irradiated with active light beam or radiation will be described. The compound generating an acid when irradiated with active light beam or radiation is a compound which is decomposed to generate an acid when irradiated with active light beam or radiation, as disclosed in Japanese Patent Application No. 10(1998)-354878 and Japanese Patent Application No. 11(1999)-143614, and from the known compounds generating an acid under the light which are used in the photo initiator for photo cation polymerization, the photo initiator for photo radical polymerization, the photo decolorizing agent for coloring matters, the color changing agent, the micro resist, or the like, and the mixtures of these, an appropriate one can be selected for use.

Next, the polymer which has a group capable of being decomposed by an acid, and the solubility of which in an aqueous alkali developing solution is increased under the action of the acid will be described. As the polymer which has a group capable of being decomposed by an acid, and the solubility of which in an aqueous alkali developing solution is increased under the action of the acid, those having a repetitive unit expressed by the following general formula [V], as disclosed in Japanese Patent Application No. 10(1998)-354878 and Japanese Patent Application No. 11(1999)-143614 or Japanese Patent Application No. 11(1999)-331568, can be mentioned.

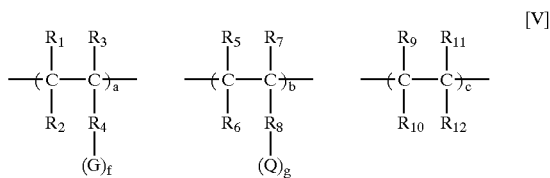

[V]

Where, in the general formulae [V], $R_1$ to $R_3$, $R_5$ to $R_7$, and $R_9$ to $R_{11}$ may or may not be the same as one another, and are each an alkyl group, aralkyl group, or alkoxy group which may have a hydrogen atom, a halogen atom, or a group expressed by —$COZR_{13}$, or a substituent.

$R_4$ and $R_8$ may or may not be the same as one another, and are each a single bond or a group having a valence of 2 to 5 which is expressed by the following formula.

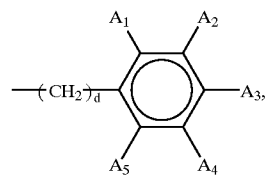

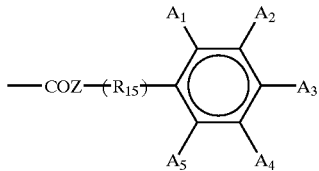

Where $A_1$ to $A_5$ may or may not be the same as one another, and each denote a hydrogen atom, —$(R_{14})_e$ or a single bond, and at least one of the $A_1$ to $A_5$ denotes a single bond.

$R_{14}$ is defined in the same manner as $R_1$ to $R_3$, $R_5$ to $R_7$, and $R_9$ to $R_{11}$.

$R_{15}$ is a single bond or a group expressed by —$R_{30}$—$Y_3$—.

Z denotes a single bond or a group expressed by —O—, —NH—, or —$NR_{25}$—.

$Y_3$ is a single bond or —S—, —O—, or —OC(=O)—.

$R_{13}$ and $R_{25}$ may or may not be the same as one another, and each denote an alkyl group, cycloalkyl group, or aralkyl group which may have a substituent.

$R_{30}$ is an alkylene group or cycloalkylene group which may have a substituent.

$R_2$ and $R_4$ or $R_6$ and $R_8$ may be bonded to each other to form the following group.

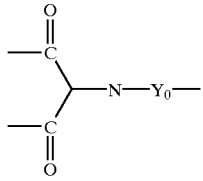

In the above group, $Y_0$ is synonymous to $R_4$ and $R_8$, and $Y_0$ is bonded to G or Q. G denotes a group selected from the group of chemical groups comprising —OH, —COOH, —$CONHCOR_{16}$, —$CONHSO_2$—$R_{16}$, and —$SO_2NH$—$R_{16}$.

$R_{16}$ is an alkyl group, cycloalkyl group, acyl group, or aryl group which may have a substituent.

Q denotes a group selected from the following group of chemical groups.

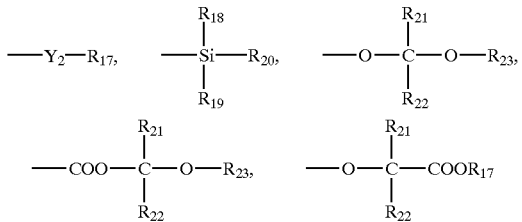

$Y_2$ denotes —O—, —O—C(=O)—O—, or —COO—.

$R_{18}$, $R_{19}$, $R_{21}$, and $R_{22}$ may or may not be the same as one another, and is each an alkyl group having 1 to 4 carbon atoms which may have a hydrogen atom or a halogen atom as a substituent.

$R_{20}$ is an alkyl group having 1 to 4 carbon atoms which may have a silyl group, an oxysilyl group, or a halogen atom as a substituent.

$R_{23}$ is an alkyl group, cycloalkyl group, aralkyl group, alkenyl group, aryloxyalkyl group, aralkyloxyalkyl group, or cycloalkyl-alkyl group which may have a hydroxyl group, halogen atom, acyl group, or a substituent.

$R_{17}$ denotes either of the following groups.

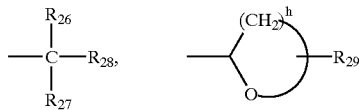

The above $R_{26}$ and $R_{27}$ are each synonymous to the above $R_{18}$, $R_{19}$, $R_{21}$, and $R_{22}$. $R_{28}$, is an alkyl group, cycloalkyl group, aryl group, or aralkyl group which may have a substituent. $R_{26}$ and $R_{27}$ and/or $R_{28}$ may be bonded to one another to form a single ring or multiple ring having 4 to 9 members.

$R_{29}$ is an alkyl group, cycloalkyl group, aryl group, aralkyl group, alkoxy group, acyl group, acylamino group, or alkoxycarbonyl group which may have a hydrogen atom, halogen atom, or a substituent.

$R_{12}$ is an alkyl group, aralkyl group, or alkoxy group which may have a hydrogen atom, halogen atom, or a substituent, or a group expressed by —$COZR_{13}$ (Z and $R_{13}$ are synonymous to the above Z and $R_{13}$), or either of the following substituents.

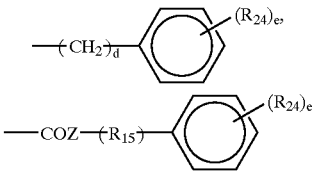

In the above formula, Z and $R_{15}$ are synonymous to the above Z and $R_{15}$. $R_{24}$ is synonymous to the above $R_{29}$.

a, c, and d are each 0 or a positive integer, and b is a positive integer. e is 0 or an integer of 1 to 4; f and g are each an integer of 1 to 4; and h is an integer of 1 to 6.

Further, as the polymer the solubility of which in an aqueous alkali developing solution is increased under the action of the acid, those containing a repetitive unit comprising a group expressed by the following general formula [VI], general formula [VI], or general formula [VIII] in the side chain, as disclosed in Japanese Patent Application No. 11(1999)-20224, can also be mentioned.

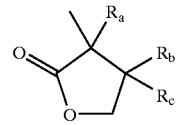 [VI]

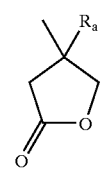 [VII]

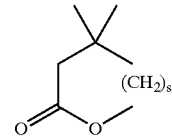 [VIII]

In the general formulae [VI] to [VIII], Ra, Rb, and Rc each denote a hydrocarbon group which may have a hydrogen atom, or a substituent, independently of each other. s denotes an integer of 2 or greater.

Further, as the polymer the solubility of which in an aqueous alkali developing solution is increased under the action of the acid, that having a repetitive unit expressed by the following general formula [IX], as disclosed in Japanese Patent Application No. 11(1999)-31591, can also be mentioned.

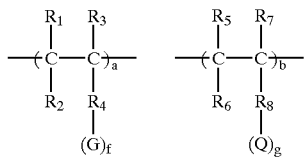

[IX]

In the general formula [IX], $R_1$ to $R_3$ and $R_5$ to $R_7$ may or may not be the same as one another, and are each an alkyl group, aralkyl group, or alkoxy group which may have a hydrogen atom, halogen atom, a group expressed by —C(=O)—Z—$R_{13}$, or a substituent. Here, Z denotes a single bond, —O—, —NH—, or —N($R_{25}$)—. $R_{13}$ and $R_{25}$ may or may not be the same as one another, and each denote an alkyl group, cycloalkyl group, or aralkyl group which may have a substituent.

$R_4$ and $R_8$ may or may not be the same as one another, and each denote a group having a valence of 2 to 5 which is expressed by the following formula.

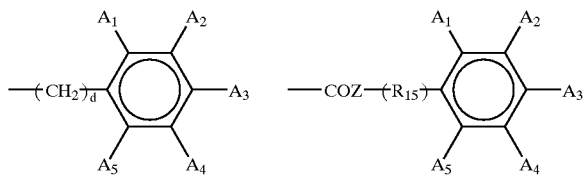

In the above formula, $A_1$ to $A_5$ may or may not be the same as one another, and each denote a hydrogen atom, —$R_{14}$ or a single bond, and at least one of the $A_1$ to $A_5$ denotes a single bond.

$R_{15}$ is a single bond or a group expressed by —$R_{30}$—$Y_3$—. Z denotes a single bond or a group expressed by —O—, —NH—, or —$NR_{25}$—.

d is an integer of 0 or greater. Here, $R_{14}$ is synonymous to $R_1$ to $R_3$ and $R_5$ to $R_7$. $R_{30}$ is an alkylene group or cycloalkylene group which may have a substituent.

$Y_3$ is a single bond, —S—, —O—, or —OC(=O)—. $R_{25}$ is synonymous to the above $R_{25}$.

$R_2$ and $R_4$ or $R_6$ and $R_8$ may be bonded to each other to form the following group.

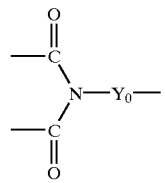

In the above group, $Y_0$ is defined in the same manner as $R_4$ and $R_8$, and $Y_0$ is bonded to G or Q. G denotes a group selected from the group of chemical groups comprising —OH, —COOH, —CONHCOR$_{16}$, —CONHSO$_2$—R$_{16}$, and —SO$_2$NH—R$_{16}$. Here, $R_{16}$ is an alkyl group, cycloalkyl group, acyl group, or aryl group which may have a substituent.

Q denotes any one of the groups expressed by the following formulae.

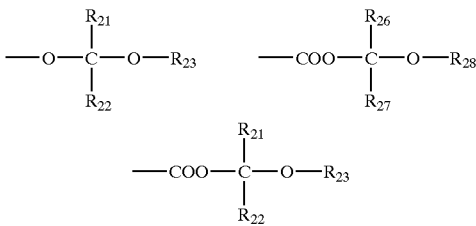

In the above formula, $R_{21}$, and $R_{22}$ may or may not be the same as one another, and is each an alkyl group having 1 to 4 carbon atoms which may have a hydrogen atom or a halogen atom as a substituent.

$R_{23}$ is an alkyl group, cycloalkyl group, aryl group, or aralkyl group which may have a substituent.

The $R_{26}$ and $R_{27}$ may or may not be the same as one another, and are each synonymous to the $R_{21}$ and $R_{22}$.

$R_{28}$ is an alkyl group, cycloalkyl group, aryl group, or aralkyl group which may have a substituent.

a is an integer of 0 or greater, and b is a positive integer. f and g are each an integer of 1 to 4.

Next, the compound which has a group capable of being crosslinked by an acid will be described. As the compound which has a group capable of being crosslinked by an acid and the solubility of which in an aqueous alkali developing solution is decreased under the action of the acid, a compound produced by causing formaldehyde to act upon melamine, benzoguanamine, glycoluryl, or the like, or its alkyl modified substance, an epoxy compound, aldehydes, an azide compound, an organic peroxide, hexamethylenetetramine, and the like can be mentioned. partially reacted products of these and aqueous-alkali-soluble plastics can be effectively used.

The compounds for use in the embodiments of the present invention which have an olefin unsaturated group preferably have a boiling point of 100° C. or over under the normal pressure.

What is claimed is:

1. A fine pattern forming method wherein a first resist layer capable of being removed by dry etching, and a photosensitive second resist layer having a resistance to dry etching with which only the irradiated portion or only the non-irradiated portion is made soluble in a developing solvent are stacked together in this order for creating a recording material, and by means for generating near field light on the projected light, said near field light is projected onto the second resist layer of said recording material in the form of a desired pattern; thereafter, by processing the second resist layer for development, a pattern is formed in said second resist layer; and by using the pattern as a mask, said first resist layer is dry-etched to form a pattern on the substrate of said recording material.

2. A fine pattern forming method according to claim 1 wherein said second resist layer has a film thickness of 100 nm or less.

3. A fine pattern forming method according to claim 1 or 2 wherein antireflection means against said projected light is provided on said substrate.

4. A fine pattern forming method according to claim 3 wherein said antireflection means is an antireflection film formed between the substrate and said first resist layer.

5. A fine pattern forming method according to claim 3 wherein said antireflection means is an antireflection film formed between the first resist layer and the second resist layer.

6. A fine pattern forming method according claim 1 wherein said means for generating near field light is a mask with which the near field light is generated from a metallic pattern formed on a material having a permeability to said projected light, and the metallic pattern is tightly contacted with said second resist layer or brought close thereto within the reach of said near field light to carry out exposure.

7. A fine pattern forming method according to claim 1 wherein said means for generating near field light is an optical stamp with which a convexity and concavity pattern is formed on the surface of a material having a permeability to said projected light, and near field light is generated from said convexity and concavity pattern by total reflection, and the convexity and concavity pattern is tightly contacted with said second resist layer or brought close thereto within the reach of said near field light for carrying out exposure.

8. A fine pattern forming method according to claim 1 wherein said means for generating near field light is a probe having an opening with a diameter smaller than the wavelength of said projected light, and the probe is moved on said second resist to carry out exposure.

9. A fine pattern forming method according to claim 6 or 7 wherein said second resist layer and said means for generating near field light are tightly contacted with each other by carrying out evacuation in said exposure device for projecting said near field light.

10. A fine pattern forming method according to claim 6 or 7 wherein said second resist layer and said means for generating near field light are tightly contacted with each other by carrying out evacuation in said exposure device and blowing air from the back of said substrate for projecting said near field light.

11. A fine pattern forming method according claim 1 wherein said first resist layer is etched by oxygen plasma.

12. A fine pattern forming method according claim 1 wherein said second resist layer comprises a pattern forming material which contains a compound having silicon atoms.

13. A fine pattern forming method according to claim 12 wherein the content of said silicon atoms is 1% to 50% of the solid content in said second resist layer.

14. A fine pattern forming method according claim 1 wherein said second resist layer comprises a pattern forming material which contains at least one of a naphthoquinone diazide compound and a diazo ketone compound, and a water-insoluble and alkali-soluble silicone-containing polymer.

15. A fine pattern forming method according claim 1 wherein said second resist layer comprises a pattern forming material which contains a water-insoluble and alkali-soluble silicone-containing polymer, a compound generating an acid when irradiated with active light beam or radiation, and a high molecular or low molecular compound which has a group capable of being decomposed by an acid, and the solubility of which in an aqueous alkali developing solution is increased under the action of the acid.

16. A fine pattern forming method according claim 1 wherein said second resist layer comprises a pattern formation material which contains a water-insoluble silicone-containing polymer which has a group capable of being decomposed by an acid, the solubility of which in an aqueous alkali developing solution is increased under the action of the acid, and which has a functional group, a compound generating an acid when irradiated with active light beam or radiation, and a high molecular or low molecular compound which has a group capable of being crosslinked by the acid.

17. A fine pattern forming method according claim 1 wherein said second resist layer comprises a pattern formation material which contains a water-insoluble silicone-containing polymer which has an olefin unsaturated group and the solubility of which in an aqueous alkali developing solution is decreased through the polymerization reaction, and a compound providing a polymerization reaction initiating capability when irradiated with active light beam or radiation.

18. A fine pattern forming method according claim 1 wherein said second resist layer comprises a pattern formation material which contains a water-insoluble and alkali-soluble silicone-containing polymer, a compound providing a polymerization reaction initiating capability when irradiated with active light beam or radiation, and a high molecular or low molecular compound which has an olefin unsaturated group and the solubility of which in an aqueous alkali developing solution is decreased through the polymerization reaction.

* * * * *